(12) United States Patent
Cai et al.

(10) Patent No.: US 10,742,197 B2
(45) Date of Patent: Aug. 11, 2020

(54) TEMPERATURE STABLE OSCILLATOR

(71) Applicant: STMicroelectronics Asia Pacific Pte Ltd, Singapore (SG)

(72) Inventors: Li Cai, Singapore (SG); Yannick Guedon, Singapore (SG); Hugo Gicquel, Grenoble (FR)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 0 days.

(21) Appl. No.: 16/200,975

(22) Filed: Nov. 27, 2018

(65) Prior Publication Data

US 2020/0169221 A1  May 28, 2020

(51) Int. Cl.
*H03K 3/011* (2006.01)
*H03K 3/03* (2006.01)
*H03L 1/02* (2006.01)
*G05F 3/24* (2006.01)

(52) U.S. Cl.
CPC ............ *H03K 3/011* (2013.01); *G05F 3/245* (2013.01); *H03K 3/0315* (2013.01); *H03L 1/02* (2013.01)

(58) Field of Classification Search
CPC .... H03K 3/0315; H03K 3/354; H03K 3/0231; H03K 4/501; H03K 4/502; H03K 3/011; H03L 1/02; G05F 3/245
See application file for complete search history.

(56) References Cited

U.S. PATENT DOCUMENTS 9,112,513 B2 * 8/2015 Gajda .................. H03L 1/02
9,350,292 B2 * 5/2016 Mitarashi ............. H03B 5/04

* cited by examiner

*Primary Examiner* — Ryan Johnson
(74) *Attorney, Agent, or Firm* — Crowe & Dunlevy

(57) ABSTRACT

An oscillator circuit includes a first current generator circuit that generates a current complementary to absolute temperature and a second current generator that generates a current proportional to absolute temperature. A temperature slope control circuit adjusts slopes of the current complementary to absolute temperature and the current proportional to absolute temperature in a complementary fashion and adds the current complementary to absolute temperature to the current proportional to absolute temperature after slope control to produce a temperature independent current. A current control circuit adjusts magnitude of the temperature independent current to produce a magnitude adjusted temperature independent current. A current controlled oscillator generates an output signal as a function of the magnitude adjusted temperature independent current.

13 Claims, 16 Drawing Sheets

TEMPERATURE STABLE OSCILLATOR

TECHNICAL FIELD

This disclosure is directed to the field of temperature-stable oscillators that are not crystal based.

BACKGROUND

Microelectromechanical devices (referred to as MEMS devices) are becoming commonplace in modern technology such as smartphones, smartwatches, and picoprojectors. Of particular concern with MEMS devices is that their behavior remain consistent or constant over a range of temperature. This in turn requires that oscillators used to generate clock signals used by such MEMS devices provide a stable and constant frequency output over a range of temperatures.

While a common quartz crystal is capable of providing this function, typical MEMS devices lack the available space to include a quartz crystal. Therefore, there is a need for on-chip clock signal generation by a non-crystal based oscillator that is capable of providing the required stable and constant frequency output over a range of temperatures.

One prior approach has been to design an RC oscillator utilizing resistors constructed from materials that have a resistance that remains constant over temperature. However, this temperature independence tends to be only under common operating conditions, and in some conditions, the resistance may vary undesirably, leading to change in frequency of the generated clock signal. To address this, such prior approaches utilize resistor trimming circuits.

While this trimming can be effective, it requires testing under different temperatures in order to tune the trimming circuit properly. Unfortunately, such testing at temperature is difficult in a production environment, as the thermal cycling involved consumes a large amount of time and is costly. In addition, the measurement of the temperature of a chip itself is difficult. Also, moving wafers between different pieces of equipment is difficult and costly. Compounding all of this is the fact that measurement error may be introduced depending on equipment calibration.

As a consequence, new designs for non-crystal based oscillators capable of providing stable and consistent output over temperature are needed. Also, quicker and less expensive methods of testing such oscillators are needed.

SUMMARY

Disclosed herein is an electronic device including a first current generator circuit configured to generate a current complementary to absolute temperature, a second current generator configured to generate a current proportional to absolute temperature, a temperature slope control circuit configured to adjust slopes of the current complementary to absolute temperature and the current proportional to absolute temperature in a complementary fashion and to add the adjusted slope current complementary to absolute temperature to the adjusted slope current proportional to absolute temperature to produce a temperature independent current, a current control circuit configured to adjust a magnitude of the temperature independent current to produce a magnitude adjusted temperature independent current, and a current controlled oscillator configured to generate an output signal as a function of the magnitude adjusted temperature independent current.

A feedback control circuit may be configured to affect the adjustment of the slopes of the current complementary to absolute temperature and the current proportional to absolute temperature as a function of the output signal.

A heating circuit may be configured to vary temperature of components of the current controlled oscillator.

The temperature slope control circuit may adjust the slopes of the current complementary to absolute temperature and the current proportional to absolute temperature in response to a first control signal.

The current control circuit may adjust the magnitude of the temperature independent current in response to a second control signal.

A built in self test circuit may be configured to receive the output signal, to compare a frequency of the output signal to a desired frequency, and to send results of the comparison to automated test equipment. The first and second control signals may be received from the automated test equipment.

A heating circuit may be configured to vary temperature of components of the current controlled oscillator in response to a third control signal received from the automated test equipment.

A built in self test circuit may be configured to receive the output signal and to generate the first and second control signals based upon a frequency of the output signal.

A heating circuit may be configured to vary temperature of components of the current controlled oscillator in response to a third control signal received from the built in self test circuit.

Also disclosed herein are method embodiments. One is a method of calibrating an oscillator. This method includes generating a current complementary to absolute temperature, generating a current proportional to absolute temperature, generating a temperature independent current from the current complementary to absolute temperature and the current proportional to absolute temperature, generating an output signal based upon the temperature independent current, measuring a frequency of the output signal, and if the frequency of the output signal is not within a coarse threshold of a desired frequency, adjusting slopes of the current complementary to absolute temperature and the current proportional to absolute temperature in a complementary fashion until the frequency of the output signal is within the coarse threshold of the desired frequency.

After the frequency of the output signal is within the coarse threshold of the desired frequency, the method may include adjusting a magnitude of the temperature independent current, activating a self heating circuit to alter temperature of at least a portion of the oscillator, and if the frequency of the output signal is not within a fine threshold of a desired frequency, adjusting the magnitude of the temperature independent current and/or adjusting the temperature of at least the portion of the oscillator until the frequency of the output signal is within the fine threshold of the desired frequency.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Disclosed herein is an oscillator circuit that generates a stable output over a range of temperature variation, that does so without the use of a crystal oscillator, and that is capable of being fabricated in a size small enough to fit within a MEMS circuit package. First, the oscillator circuit will be described, and thereafter, testing and tuning of the oscillator circuit will be described.

A. Description of Oscillator Circuit

Figure 1:
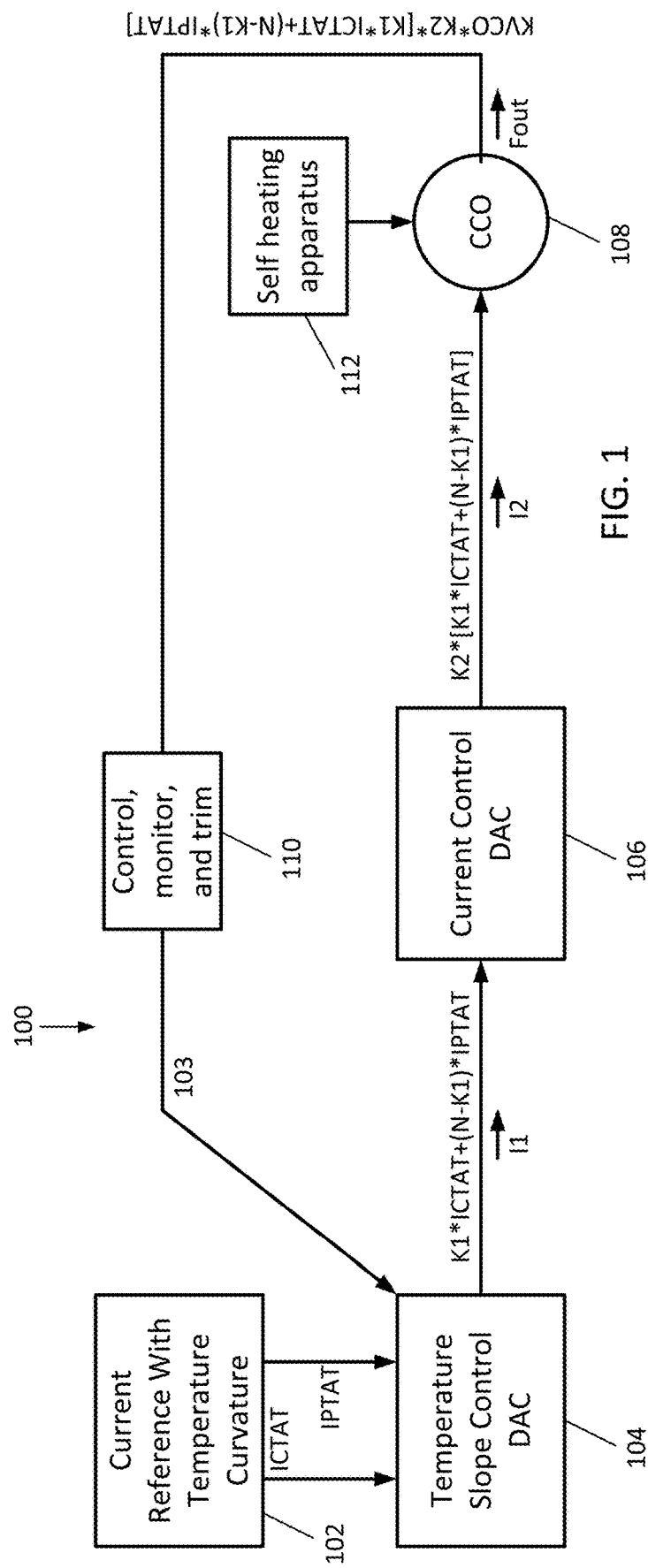
FIG. 1 is a block diagram of an oscillator circuit disclosed herein.

Referring to FIG. 1, the oscillator circuit 100 includes a current generator circuit 102 that generates a current complementary to absolute temperature ICTAT and a current proportional to absolute temperature IPTAT.

A temperature slope control circuit 104 (which can be considered to be a digital to analog converter (DAC) in some cases) adjusts the slopes of ICTAT and IPTAT in a complementary fashion based upon a feedback control signal 103. The temperature slope control circuit 104, after slope adjustment, adds ICTAT and IPTAT to produce a temperature independent current I1. The slope of ICTAT is modified by a constant K1, and the slope of IPTAT is modified by N−K1, so that I1=K1*ICTAT+(N−K1)*IPTAT.

A current control circuit 106 (which can be considered to be a digital to analog converter in some cases) receives I1 and adjusts the magnitude of its slope to produce a magnitude adjusted temperature independent current I2. The magnitude of the slope of I1 is modified by a constant K2 so that I2=K2*[K1*ICTAT+(N−K1)*IPTAT]. I2 is used to control a current controlled oscillator (CCO) 108, which produces an output signal Fout having a current Iout. Iout can be represented as Iout=KVCO*K2*[K1*ICTAT+(N−K1)*IPTAT].

A feedback control circuit 110 receives Fout and from it generates the feedback based control signal 103 for the temperature slope control circuit 104.

Figure 2:
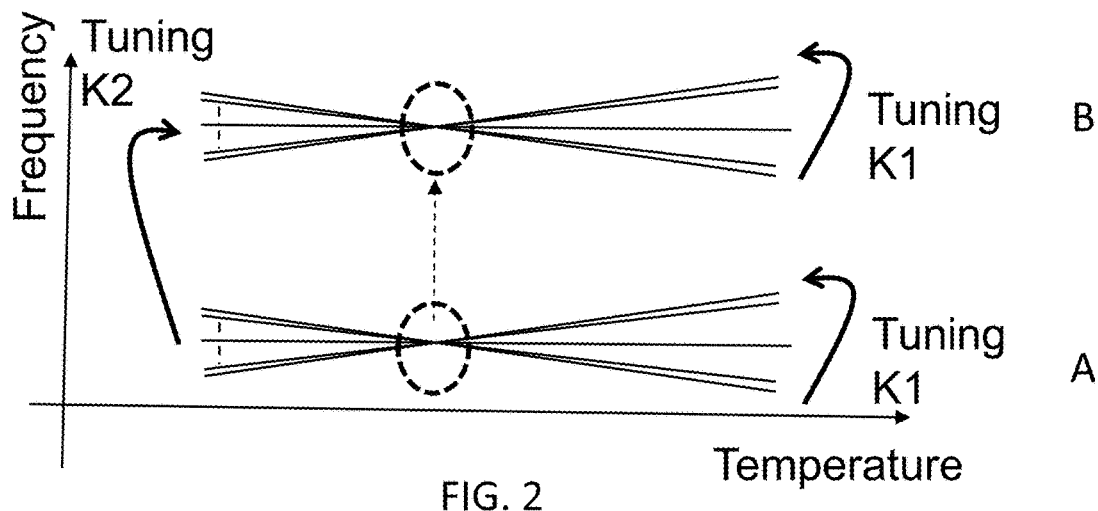
FIG. 2 is a graph showing the effect of tuning the slopes of IPTAT and ICTAT of FIG. 1 in a complementary fashion, as well as the effect of adjusting the magnitude of the current I1 of FIG. 1.

The effect of the tuning of K1 can be seen in traces A and B of FIG. 2. The arrows on the right side of the traces indicate that the different traces are different frequency output versions of the output signal, with the difference being the value of K1. The effect of the tuning of K2 can be seen in traces A and B of FIG. 2. The arrow on the left side of the traces A and B shows that based on the tuning of K2 the traces can move from position A to position B. Thus, K1 adjusts the slope of the output signal (in terms of frequency vs. temperature), while K2 adjusts the magnitude of the output signal.

Figure 3:
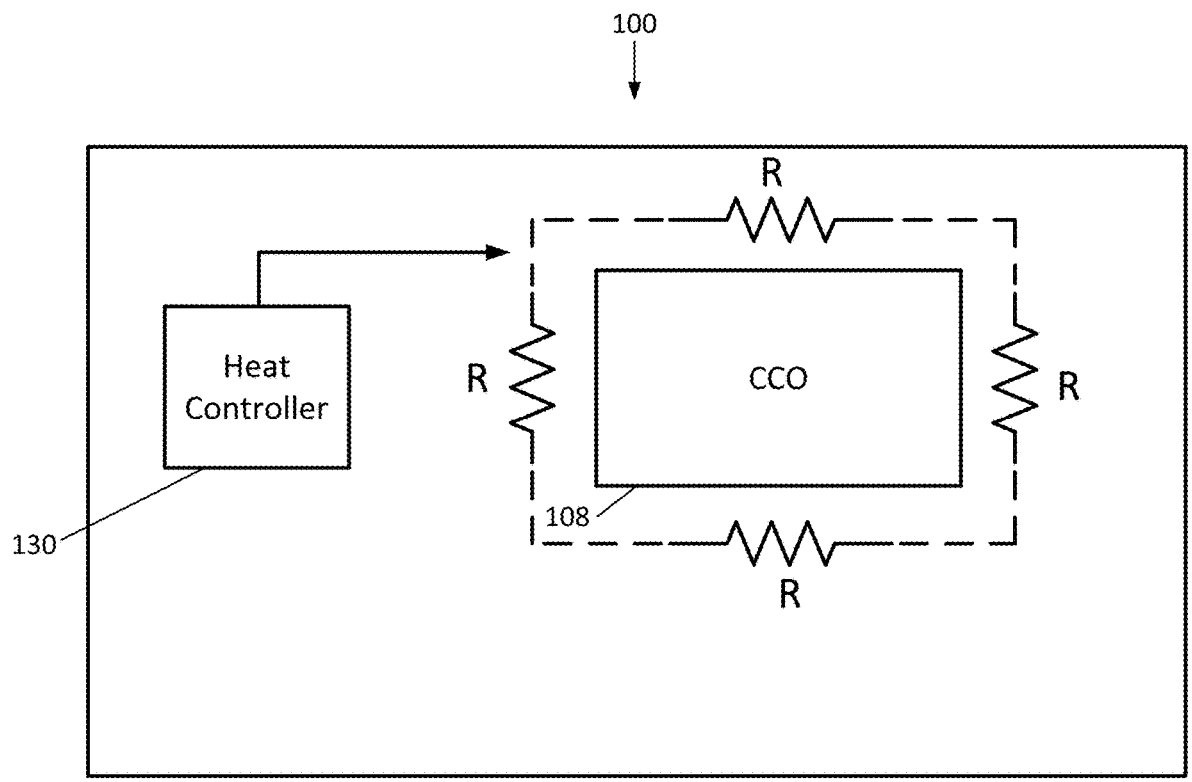
FIG. 3 is a top plan view of an integrated circuit including the oscillator circuit of FIG. 1.

A self heating apparatus 112 serves to modify the current controlled oscillator 108 temperature to help producing different CCO output frequencies at different temperatures. The self heating apparatus 112 can be heating elements, such as resistors, placed about the CCO 108, as shown in FIG. 3. Assuming the thermal resistance of the packaging of the chip being 125° C. per watt, a power dissipation of 0.4 W is achieved using resistors of 32.4Ω supplied with 3.6 V and this leads to a potential temperature elevation of 50° C., which allows sufficient temperature excursion on the A and B graphs for further trimming and tuning the consistency of the frequency of the output signal over temperature.

Figure 4A:
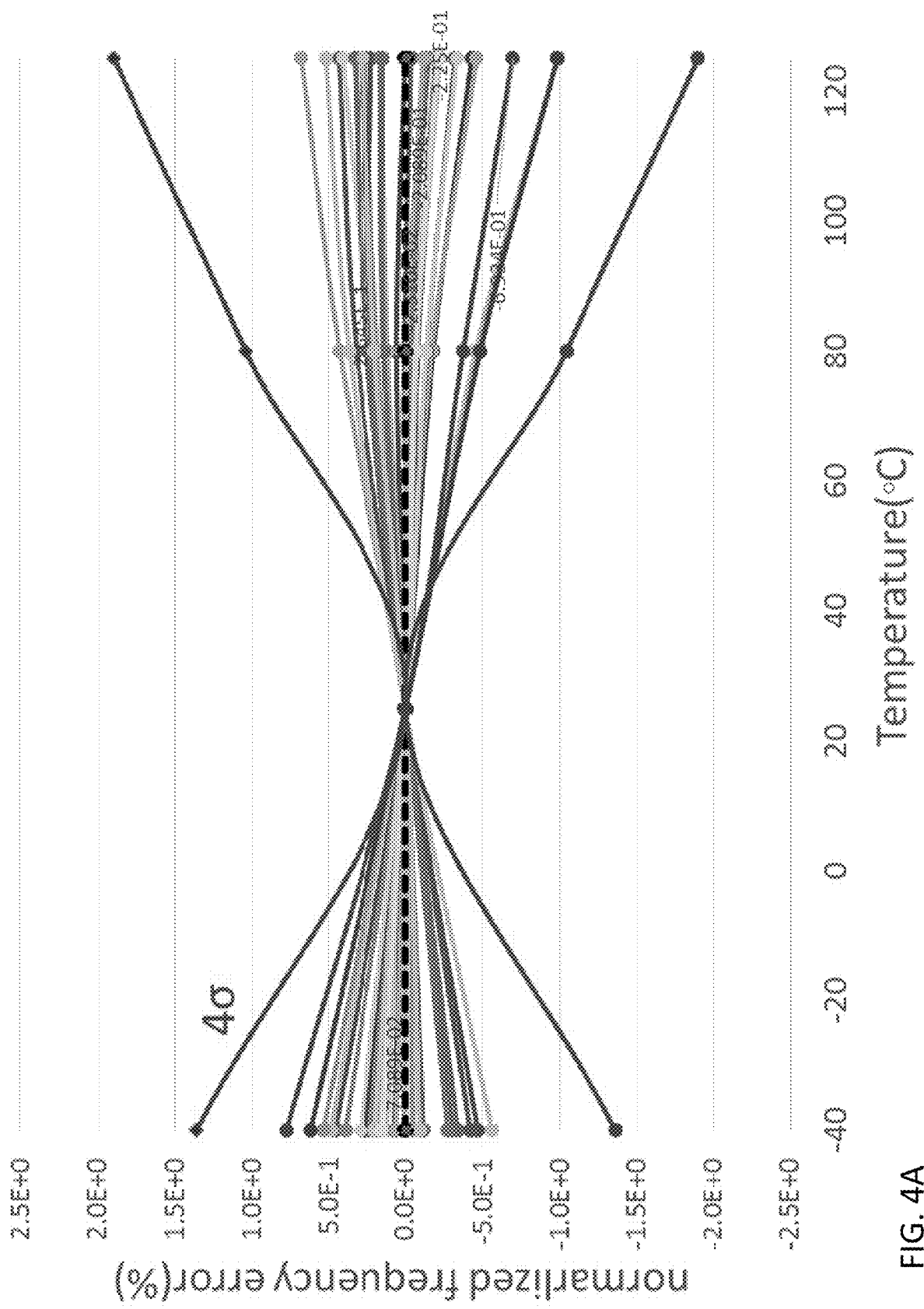
FIG. 4A is a graph showing the frequency stability of the output signal of FIG. 1 without the use of the self heating circuit.
Figure 4B:
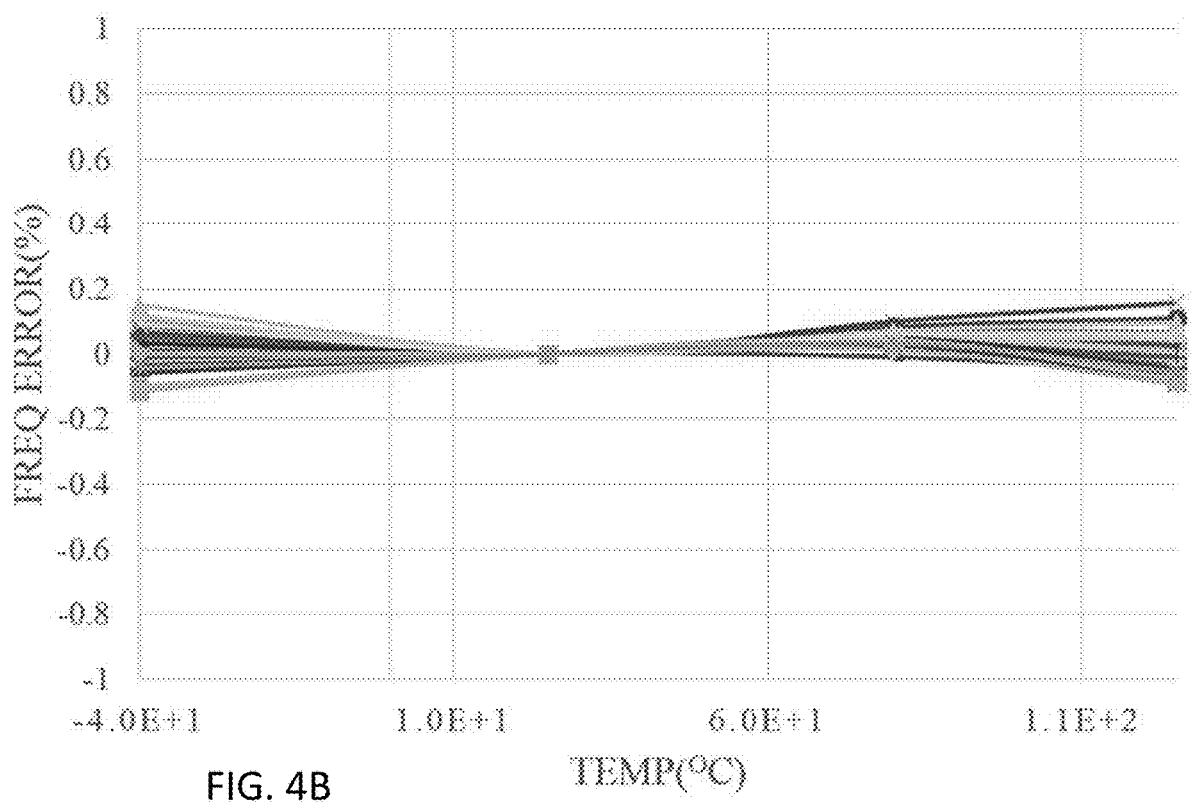
FIG. 4B is a graph showing the frequency stability of the output signal of FIG. 1 with the use of the self heating circuit.
Figure 4C:
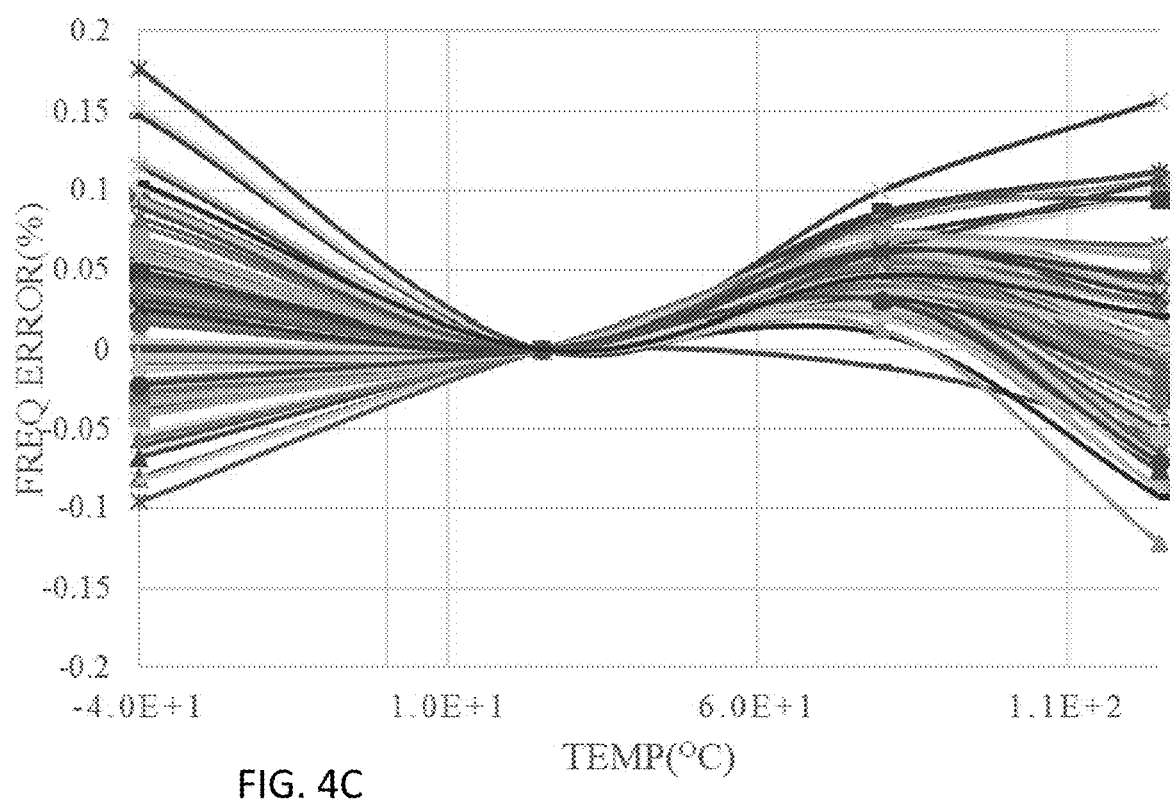
FIG. 4C is a graph showing a greatly enlarged view of a portion of the graph of FIG. 4B.

The effect of the temperature variation (whether is originated from ambient environment or whether it is forced by self-heating apparatus 112) on the output signal can be seen in the series of FIGS. 4A-4C. In FIG. 4A, the output signal is shown without trimming. The result is that the frequency stability of the output signal over temperature can be ±2%. However, when a trimming is applied, the frequency stability of the output signal over temperature can be improved to ±0.15%, as shown in FIGS. 4B-4C. For achieving such precision, the trimming process requires the CCO frequency to be probed at two different frequencies sufficiently distinct one from each other. The self heating apparatus 112 is advantageously used for achieving this without complex external instrumentation outside the chip, but rather by locally self heating the CCO and obtaining the increase in temperature as derived above, e.g., 50 degrees in the example.

A first example implementation of the oscillator circuit 100 is now described with reference to FIG. 5. A first current generator circuit 102a generates ICTAT. The first current generator circuit 102a includes PMOS transistors MP1 and MP2 connected in a current mirror relationship, with their sources connected to VDD and their gates connected to one another and connected to the drain of transistor MP2. NMOS transistors MN1 and MN2 are connected in a cascode configuration with their gates connected to one another. The drain of transistor MN1 is connected to the drain of transistor MP1 while the drain of transistor MN2 is connected to the drain of transistor MP2. The gates of transistors MN1 and MN2 are connected to the drains of transistors MP1 and MN1. The source of transistor MN2 is connected to ground through resistor R1. A NPN transistor QN1 has its collector connected to the source of transistor MN1, its base connected to its collector, and its emitter connected to ground.

In operation, once in a stable state, the current mirror formed from transistors MP1 and MP2 enforces equality in the drain currents of transistors MN1 and MN2, and therefore equality in the gate to source voltages Vgs of transistors MN1 and MN2. This results in the base to emitter voltage Vbe of QN1 being applied at the source of transistor MN2. The resulting current ICTAT forced across resistor R1 is complementary to absolute temperature (CTAT), and can be calculated as ICTAT=VbeQN1/R1.

A second current generator circuit 102b generates IPTAT. The second current generator circuit 102b includes PMOS transistors MP3 and MP4 connected in a current mirror relationship, with their sources connected to VDD and their gates connected to one another and connected to the drain of transistor MP4. NMOS transistors MN3 and MN4 are connected in a cascode configuration with their gates connected to one another. The drain of transistor MN3 is connected to the drain of transistor MP3 while the drain of transistor MN4 is connected to the drain of transistor MP4. The gates of transistors MN3 and MN4 are connected to the drain of transistor MN3. The source of transistor MN3 is connected to the collector of NPN transistor QN2. The emitter of transistor QN2 is connected to ground, and the base of transistor QN2 is connected to its collector. The source of transistor MN4 is connected to resistor R2, which in turn is connected to the collector of NPN transistor QN3. The emitter of transistor QN3 is connected to ground, and the base of transistor QN3 is connected to its collector.

Once operating in a stable state, the current mirror formed from transistors MP3 and MP4 enforces equality in the drain currents of transistors MN3 and MN4, and therefore equality in the gate to source voltages Vgs of transistors MN3 and MN4. This results in the base to emitter voltage of transistor QN2 being applied at the source of transistor MN3. Since resistor R1 is therefore between the base to emitter voltages of transistors QN2 and QN3, the voltage across resistor R2 is VbeQN3-VbeQN2 and can be referred to as ΔVbe. The resulting current IPTAT forced through resistor R1 is proportional to absolute temperature (PTAT) and flows into transistor QN2 due to the current mirror formed from transistors MN3 and MN3. IPTAT can be calculated as:

$IPTAT=\Delta Vbe/R1$

The temperature slope control circuit 104 is arranged as a digital to analog converter and has an ICTAT branch 104a and an IPTAT branch 104b which have their outputs summed at summing node N1. The ICTAT branch 104a includes a number n of PMOS transistors Q1 . . . Qn, each with its source connected to VDD, its drain connected to a first terminal of a respective one of a number n of switches Sc1 . . . Scn, and its gate connected to the gates of transistors MP1 and MP2. The second terminals of switches Sc1 . . . Scn are connected to node N1, and therefore switches Sc1 . . . Scn serve to selectively couple transistors Q1 . . . Qn to node N1. The IPTAT branch 104b includes a number m of PMOS transistors NQ1 . . . NQm, each with its source connected to VDD, its drain connected a first terminal of a respective one of a number m of switches Sp1 . . . Spm, and its gate connected to the gates of MP3 and MP4. The second terminals of switches Sp1 . . . Spm are connected to node N1, and therefore switches Sp1 . . . Spm serve to selectively connect transistors NQ1 . . . NQm to node N1. The switches Sc1 . . . Scn and Sp1 . . . Spm are controlled by the control signal 103 (which is a data bus) from the feedback control circuit 110, and K1 is tuned by altering the states of switches Sc1 . . . Scn and Sp1 . . . Spm in a complementary fashion (meaning that if Sc1 is closed, Sp1 is open, and if Sc1 is open, Sp1 is closed, for example). Therefore, the current I1 flows from node N1 toward the current control circuit 106.

The current control circuit 106, CCO 108, and self heating apparatus 112 are the same as described above with reference to FIG. 1 and need no further description.

A second example implementation of the oscillator circuit 100' is now described with reference to FIG. 6. A second current generator circuit 102b' generates IPTAT, and will be first described.

The second current generator circuit 102b' includes PMOS transistors MP7 and MP8 that have their sources connected to VDD and their gates connected to one another. An amplifier 120 has its non-inverting terminal connected to the drain of transistor MP7 and its inverting terminal connected to the drain of MP8, and has its output connected to the gates of transistors MP7 and MP8. NPN transistor QN4 has its collector connected to the source of transistor MP7, its emitter connected to ground, and its base connected to its collector. A resistor R4 is connected between the inverting terminal of the amplifier 120 and the emitter of NPN transistor QN5, which has its collector connected to ground and its base connected to its emitter. Note that transistor MP6 has its source connected to VDD and its drain connected to summing node N2 without an intervening switch In operation, once a stable state is reached, the amplifier 120 forces equality in the drain voltage of transistors MP7 and MP8. This results in the base to emitter voltage of NPN transistor QN4 being applied at the drain of transistor MP8, meaning that R4 is therefore between the base to emitter voltages of transistors QN4 and QN5. The voltage across resistor R4 is therefore VbeQN4-VbeQN5 and can be referred to as ΔVbe. The resulting current IPTAT forced through resistor R4 is proportional to absolute temperature and flows into transistor QN4 due to the current mirror effectively formed from transistors MP7 and MP8. IPTAT can be calculated as:

$IPTAT=\Delta Vbe/R4$

The first current generator 102a' generates ICTAT and is now described. The first current generator 102a' includes PMOS transistors MP5 and MP6 that have their sources connected to VDD and their gates connected to one another. An amplifier 118 has its non-inverting terminal connected to the drain of transistor MP5 and its inverting terminal connected to the collector of transistor QN4 of the second current generator circuit 102b'. A resistor R3 is connected between the non-inverting terminal of the amplifier 118 and ground.

In operation, once a stable state is reached, the amplifier 118 uses VbeQN4 as a reference voltage for feedback, forcing the drain voltage of MP5 to the VbeQN4 value. This in turn causes a current complementary to absolute temperature ICTAT to flow through resistor R3, which is then mirrored to the drain of transistor MP6 via the current mirror relationship forced on transistors MP5 and MP6 by the amplifier 118. ICTAT can be calculated as ICTAT=VbeQN4/R3. Note that using VbeQN4 for generating ICTAT helps to reduce system dispersions due to the mismatch between ICTAT and IPTAT currents, as it removes one device source of mismatch. Note also that in this second implementation the voltages applied across the resistors R3, transistor QN4 and resistor R4 in series with transistors QN5 are strictly equal, while in the first implementation the voltages are subject to the Vgs (MN1, MN2, MN3, MN4) mismatches and variations. The second implementation, while still not ideal in this aspect, is however exhibiting better performance and is especially more linear for what concerns the variation versus temperature of the overall current it produces.

The temperature slope control circuit 104 is arranged as a digital to analog converter and has an ICTAT branch 104a and an IPTAT branch 104b which have their outputs summed at summing node N2. The ICTAT branch 104a includes a number n of PMOS transistors Q1 . . . Qn, each with its source connected to VDD, its drain connected to a first terminal of a respective one of a number n of switches Sc1 . . . Scn, and its gate connected to the gates of MP5 and MP6. The second terminals of switches Sc1 . . . Scn are connected to node N2, and therefore switches Sc1 . . . Scn serve to selectively couple transistors Q1 . . . Qn to node N2. The IPTAT branch 104b includes a number m of PMOS transistors NQ1 . . . NQm, each with its source connected to VDD, its drain connected a first terminal of a respective of a number nn of switches Sp1 . . . Spm, and its gate connected to the gates of transistors MP7 and MP8. The second terminals of switches Sp1 . . . Spm are connected to node N2, and therefore switches Sp1 . . . Spm serve to selectively connect transistors NQ1 . . . NQm to node N2. Although not shown in FIG. 5, note that the switches Sc1 . . . Scn and Sp1 . . . Spm are controlled by the control signal 103 from the feedback control circuit 110, and that K1 is tuned by altering the states of switches Sc1 . . . Scn and Sp1 . . . Spm in a complementary fashion (meaning that if Sc1 is closed, Sp4 is open, and if Sc1 is open, Sp4 is closed, for example). Therefore, the current I1 flows from node N2 toward the current control circuit 106.

The current control circuit 106, CCO 108, and self heating apparatus 112 are the same as described above with reference to FIG. 1 and need no further description.

Figure 5:
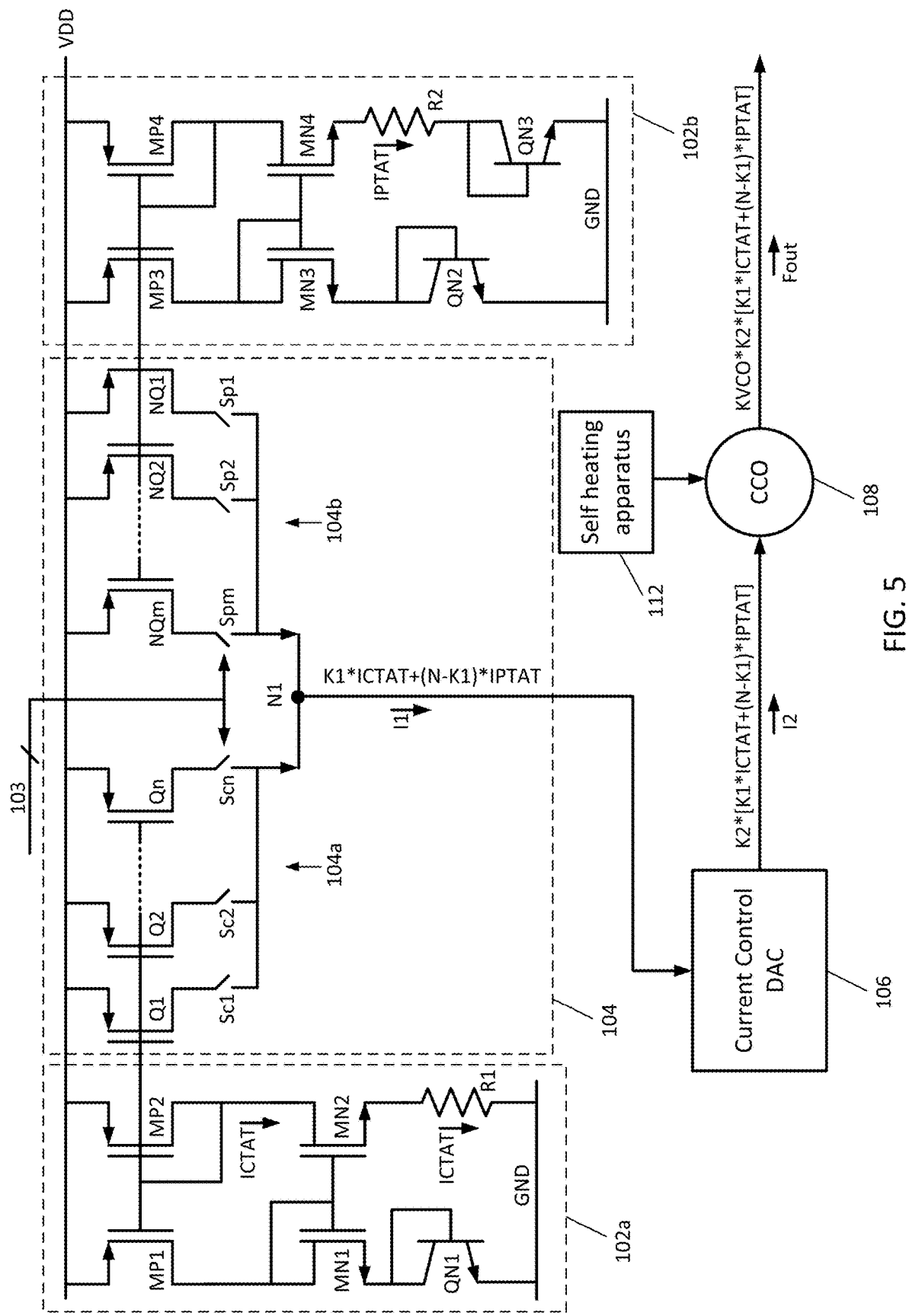
FIG. 5 is a schematic block diagram of a first embodiment of the oscillator circuit of FIG. 1.
Figure 6:
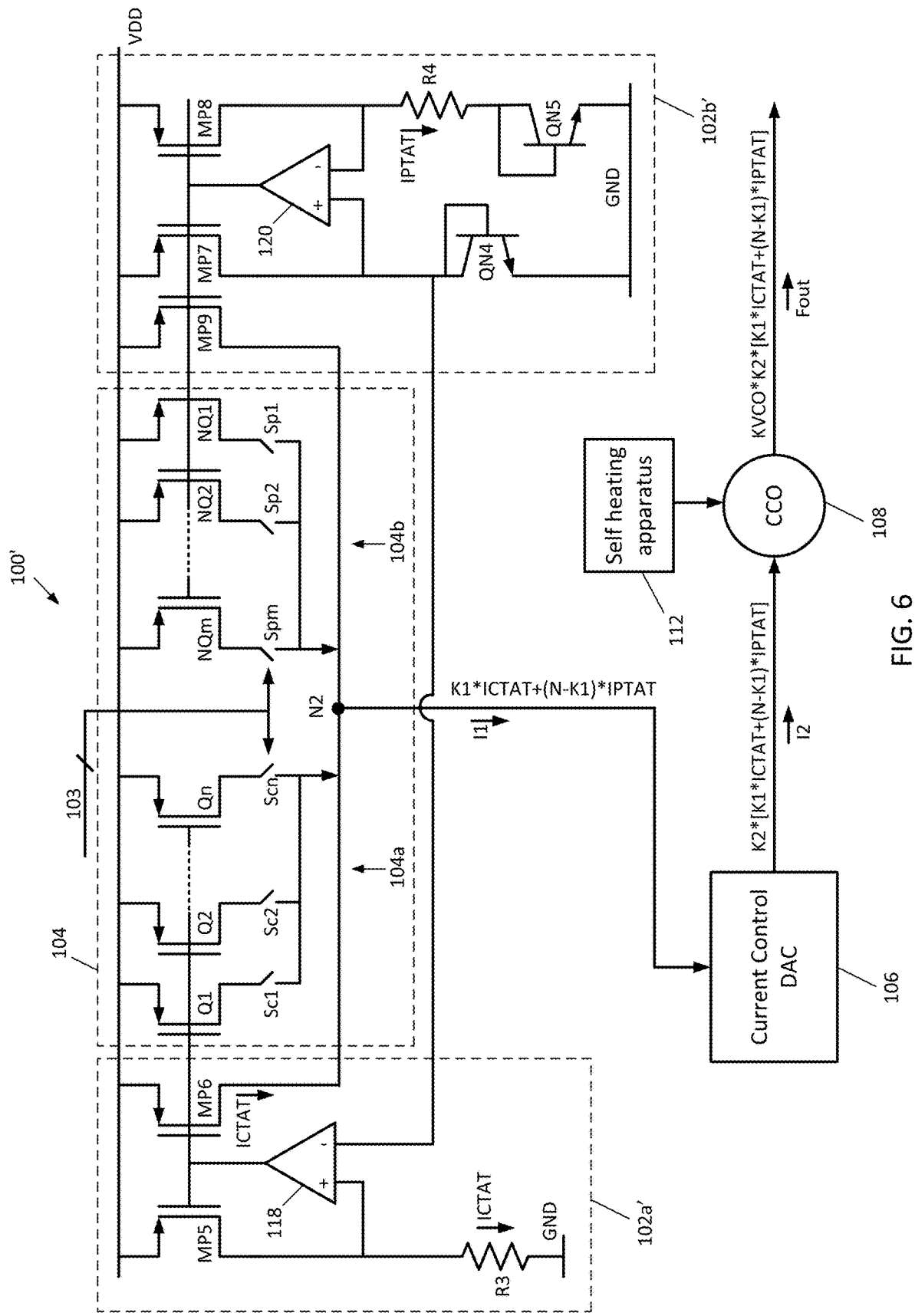
FIG. 6 is a schematic block diagram of a second embodiment of the oscillator circuit of FIG. 1.
Figure 7A:
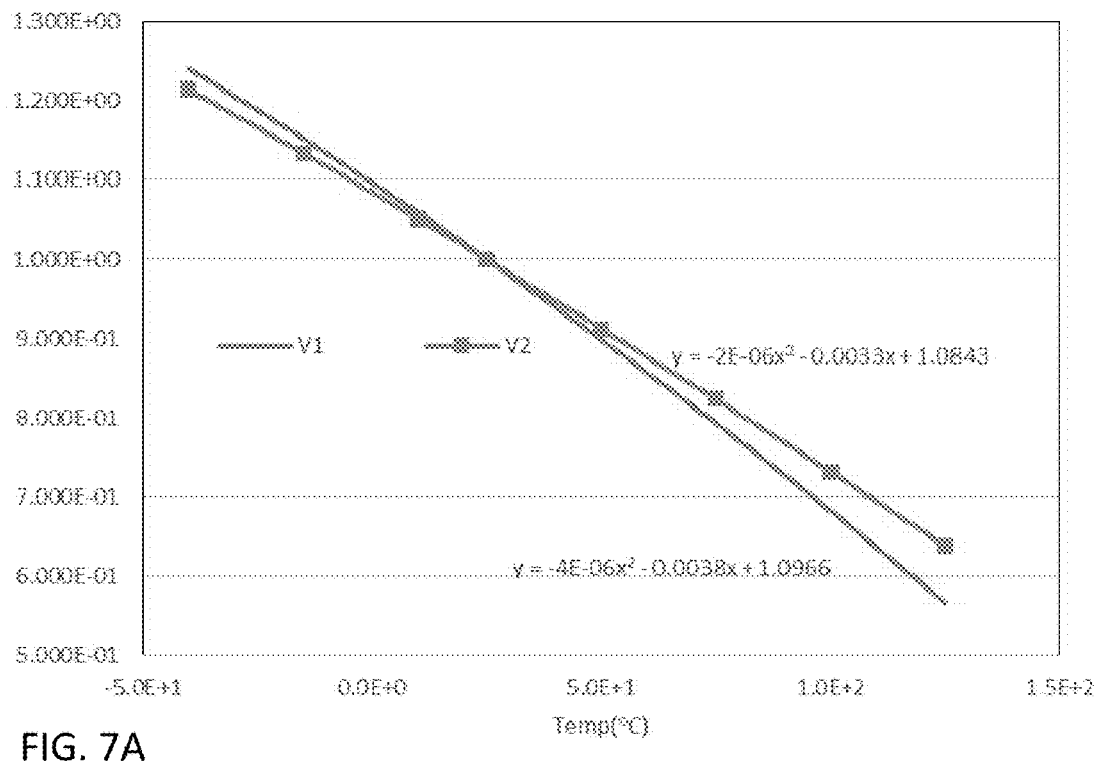
FIG. 7A is a graph showing a comparison of ICTAT between FIGS. 5 and 6.
Figure 7B:
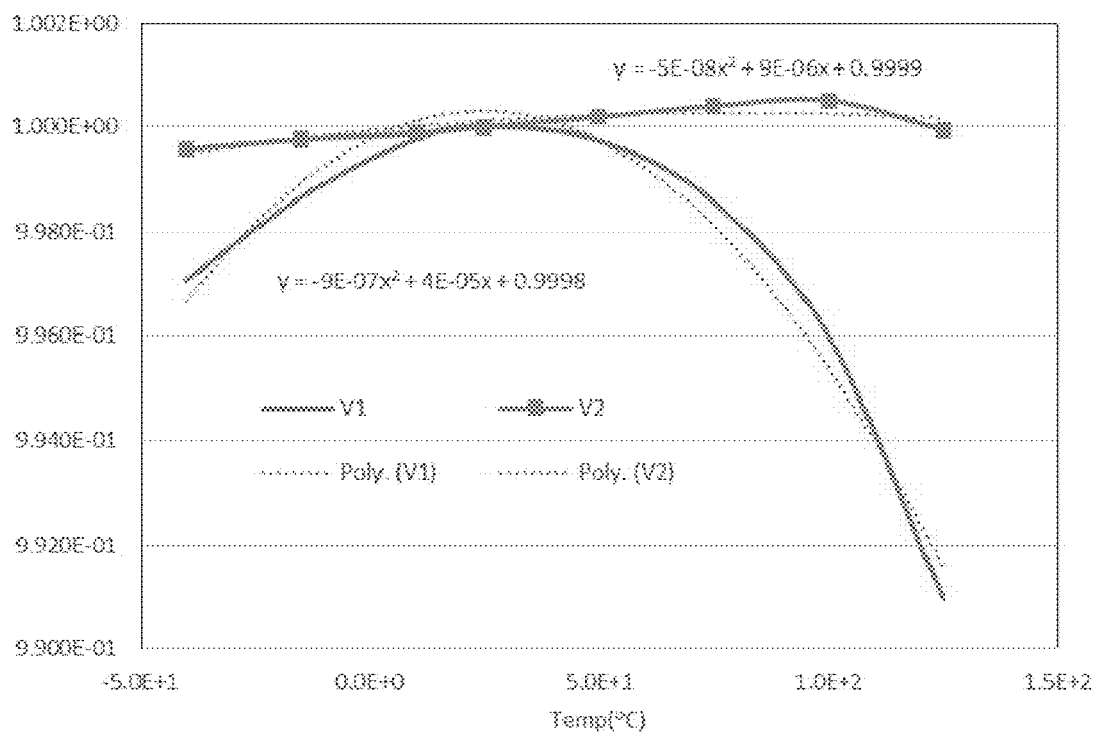
FIG. 7B is a graph showing a comparison of the frequency of the output signal of the CCO between FIGS. 5 and 6.
Figure 7C:
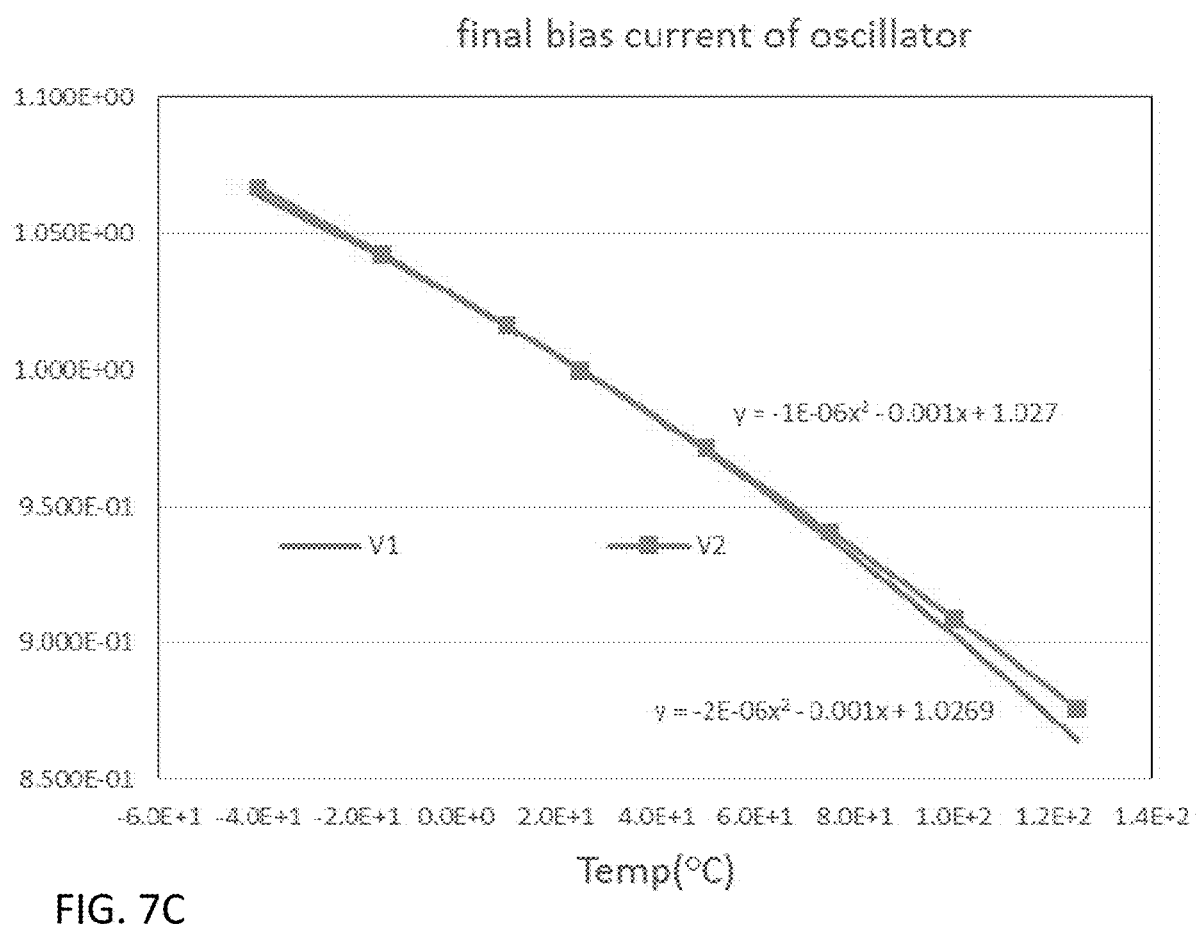
FIG. 7C is a graph showing a comparison of the current I2 between FIGS. 5 and 6.

Both the oscillator circuit 100 of FIG. 5 and the oscillator circuit 100' of FIG. 6 provide stability well in excess of the prior art. However, as can be seen in FIGS. 7A-7C, the oscillator circuit 100' of FIG. 6 provides for greater frequency stability of the output signal Fout over temperature than the oscillator circuit 100 of FIG. 5. For example, ICTAT as generated in the oscillator circuit 100' of FIG. 6 (referred to in the FIG. 7A as 'V2') has a higher degree of linearity over temperature than ICTAT as generated in the oscillator circuit 100 of FIG. 5 (referred to in the figure as 'V1'). Additionally, I2 (referred to in the FIG. 7C as the 'final bias current of oscillator') as generated in the oscillator circuit 100' of FIG. 6 has a higher degree of linearity over temperature than I2 as generated in the oscillator circuit 100 of FIG. 5. Also, the frequency of the output signal (referred to in the FIG. 7B as 'FOSC') as generated in the oscillator circuit 100' of FIG. 6 has a higher degree of linearity over temperature than the frequency of the output signal as generated in the oscillator circuit 100 of FIG. 5. Therefore, those of skill in the art will understand that the second order coefficient of the oscillator circuit 100' of FIG. 6 is reduced as compared to that of the oscillator circuit 100 of FIG. 5.

Figure 8A:
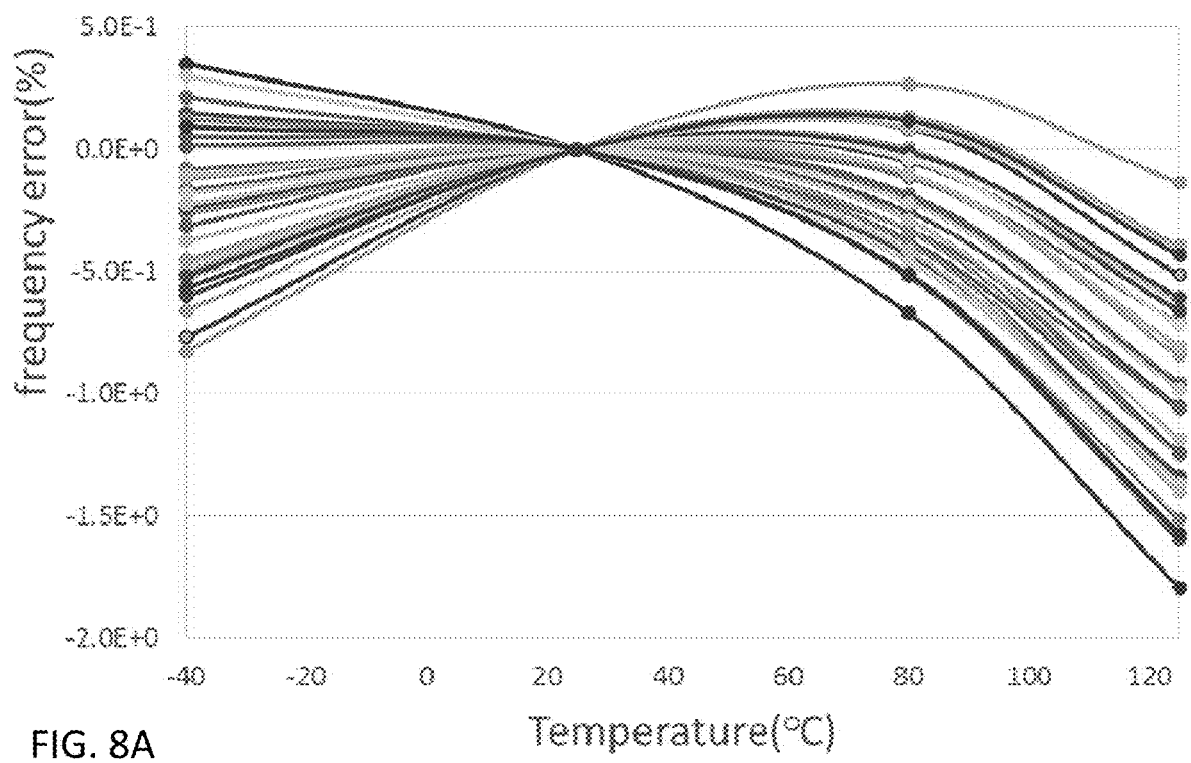
FIG. 8A is a graph showing a normalized frequency error of the output signal of the CCO of FIG. 5.
Figure 8B:
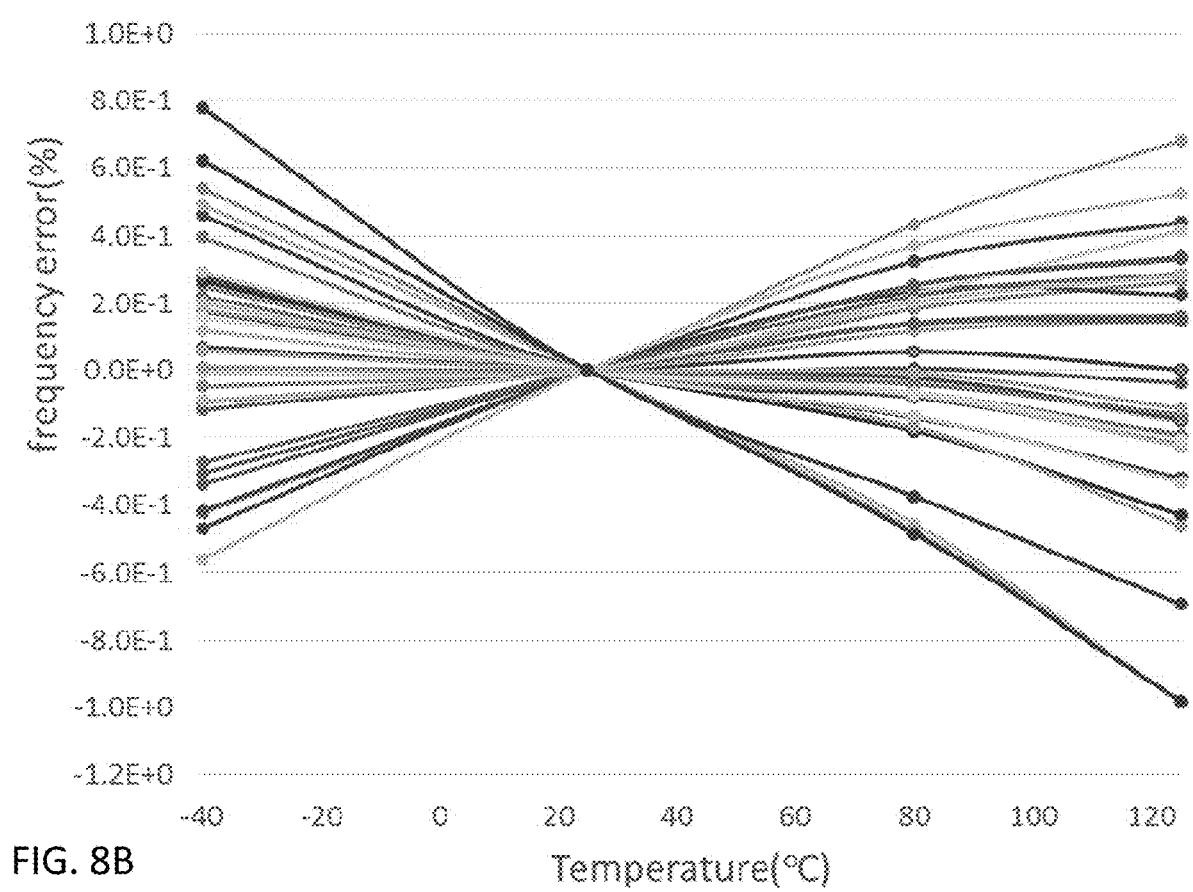
FIG. 8B is a graph showing a normalized frequency error of the output signal of the CCO of FIG. 6.

Another advantage of the design of the oscillator circuit 100' of FIG. 6 is the reduction of second order temperature curvature, which can be seen in the reduction of frequency error over temperature shown in FIG. 8B (which shows frequency error over temperature of the oscillator circuit 100' of FIG. 6) as opposed to that of FIG. 8A (which shows frequency error over temperature of the oscillator circuit 100 of FIG. 5). The linear frequency variation of the oscillator circuit 100' of FIG. 6 is easily corrected using the self heating apparatus 112. Indeed, as the variation is linear, a two-point correction is easily applicable, and the self-heating apparatus is sufficient to operate for heating the chip at two different temperatures which do not need to be precisely known as long as they are distinct enough for allowing an interpolation between the two operating points.

Figure 15:
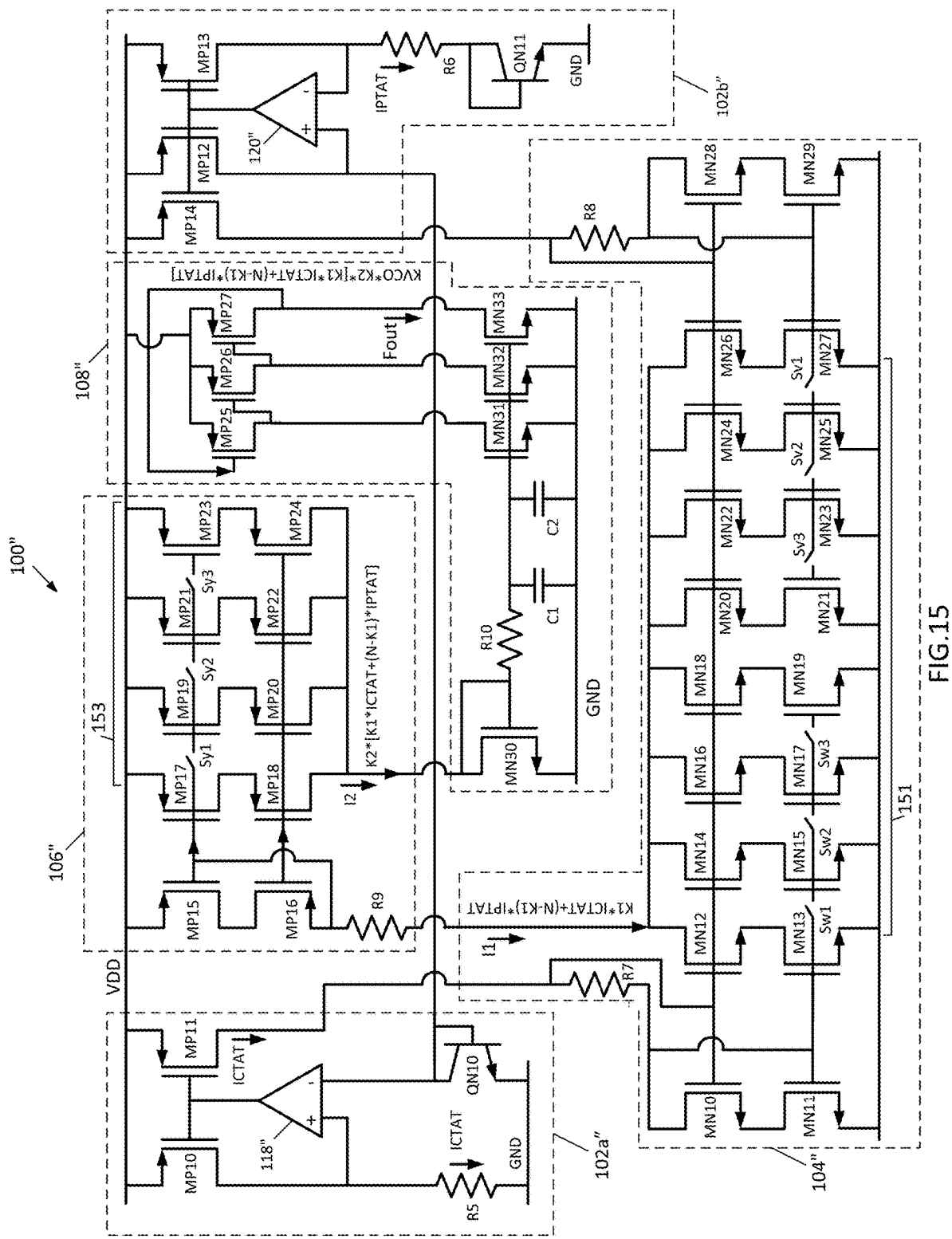
FIG. 15 is a schematic diagram of third embodiment of the oscillator circuit of FIG. 1.

Referring now to FIG. 15, a further sample implementation of the oscillator circuit 100" is now described. The oscillator circuit 100" includes ICTAT generation circuit 102a" that generates ICTAT and IPTAT generation circuit 102b" that generates IPAT.

A temperature slope control circuit 104" adjusts the slopes of ICTAT and IPTAT in a complementary fashion based upon a feedback control signal (not shown in this figure, but denoted as 103 in FIG. 1). The temperature slope control circuit 104", after slope adjustment, adds ICTAT and IPTAT to produce a temperature independent current I1. The slope of ICTAT is modified by a constant K1, and the slope of IPTAT is modified by N−K1, so that I1=K1*ICTAT+(N−K1)*IPTAT.

A current control circuit 106" receives I1 and adjusts the magnitude of its slope to produce a magnitude adjusted temperature independent current I2. The magnitude of the slope of I1 is modified by a constant K2 so that I2=K2*[K1*ICTAT+(N−K1)*IPTAT]. I2 is used to control CCO 108", which produces an output signal Fout having a current Iout. Iout can be represented as Iout=KVCO*K2*[K1*ICTAT+(N−K1)*IPTAT].

A feedback control circuit (not shown in this figure, but denoted as 110 in FIG. 1) receives Fout and from it generates the feedback based control signal for the temperature slope control circuit 104".

The ICTAT generation circuit 102a" includes PMOS transistors MP10 and MP11. Transistors MP10 and MP11 have their sources coupled to VDD and their gates coupled to one another. The drain of transistor MP10 is coupled to ground via resistor R5, and the drain of transistor MP11 is coupled to the drain of NMOS transistor MN10 (described below) via resistor R7. Amplifier 118" has its non-inverting terminal coupled to the drain of transistor MP10, and has its inverting terminal coupled to the collector of NPN transistor QN10. Transistor QN10 has its emitter coupled to ground and its base coupled to its collector.

In operation, the amplifier 118" forces equality in the drain voltage of transistor MP10 and collector voltage of bipolar transistor QN10, resulting in VbeQN10 being applied across resistor R5. ICTAT resultingly flows through resistor R5, and is mirrored to the drain of transistor MP11 via the current mirror arrangement formed by transistors MP10 and MP11.

The IPTAT generation circuit 102b" includes PMOS transistors MP12 and MP13. Transistors MP12 and MP113 have their sources coupled to VDD and their gates coupled to one another. The drain of transistor MP12 is coupled to the collector of transistor QN10, and to the non-inverting terminal of amplifier 120". The inverting terminal of amplifier 120" is coupled to the drain of transistor MP13, and is coupled to the collector of NPN transistor QN11 through resistor R6. Transistor QN11 has its collector coupled to its base and its emitter coupled to ground. PMOS transistor MP14 has its source coupled to VDD, and its drain coupled to resistor R8 (described below). Amplifier 120" also has its non-inverting terminal coupled to the collector of transistor QN10, and has its non-inverting terminal coupled to the drain of transistor MP13.

In operation, the amplifier 120" forces the drain voltage of transistor MP13 to VbeQN10, and therefore resistor R6 is between VbeQN10 and VbeQN11, and IPTAT flows across resistor R6. IPTAT is mirrored to the drain of transistor MP14 via the current mirror arrangement between transistors MP12, MP13, and MP14.

The temperature slope control circuit 104" includes resistor R7, which receives ICTAT from the ICTAT generation circuit 102a". The resistor R7 is coupled to the drain of NMOS transistor MN10, which has its source coupled to the drain of NMOS transistor MN11. Transistor MN11 has its source coupled to ground and its gate coupled to the drain of transistor MN10. The gate of transistor MN10 is coupled to the drain of transistor MP11.

The temperature slope control circuit 104" also includes resistor R8, which receives IPTAT from the IPTAT generation circuit 102b". The resistor R8 is coupled to the drain of NMOS transistor MN28 and to the gate of NMOS transistor MN29. Transistor MN28 has its drain coupled to resistor R8, its gate coupled to the drain of transistor MP14, and its source coupled to the drain of transistor MN29. The transistor MN29 has its source coupled to ground and its gate coupled to resistor R8.

The temperature slope control circuit 104" includes switched transistor circuit 151, which is coupled to the gates of transistors MN10, MN11, MN28, and MN29, and contains a given even number of series connected NMOS transistor pairs, with the drains of the top transistors of the series connected NMOS transistors being coupled to one another, with the sources of the top transistors of the series connected NMOS transistors being coupled to the drains of the bottom transistors of the series connected NMOS transistors, and with the sources of the bottom transistors of the series connected NMOS transistors being coupled to ground. The gates of the top transistors of the series connected NMOS transistors are coupled to the gates of transistors MN10 and MN28. The gates of the bottom transistors of the series connected NMOS transistors are selectively coupled to one another and to the gates of transistors MN11 and MN29 via switches. These switches are set via the feedback control signal (shown as 103 in FIG. 1), and it is the setting of these switches that adjusts K1, and thus the slopes of ICTAT and IPTAT.

The current control DAC 106" includes resistor R9 coupled to the switched transistor circuit 151 to receive the current I1. PMOS transistor MP15 has its source coupled to VDD and its drain coupled to the source of PMOS transistor MP16. Transistor MP16 has its drain coupled to resistor R9.

The current control DAC 106" also includes switched transistor circuit 153, which is coupled to the gates of transistors MP15, MP16, MP23, and MP24, and contains a given even number of series connected PMOS transistor pairs, with the series of the top transistors of the series connected PMOS transistors being coupled to VDD, with the drains of the top transistors of the series connected PMOS transistors being coupled to the sources of the bottom transistors of the series connected PMOS transistors, and with the drains of the bottom transistors of the series connected PMOS transistors being coupled to one another. The gates of the bottom transistors of the series connected PMOS transistors are coupled to the gates of transistors MP16 and MP24. The gates of the top transistors of the series connected PMOS transistors are selectively coupled to one another and to the gate of transistors MP16 via switches. These switches are set via the control signal (shown as 105 in FIG. 1), and it is the setting of these switches that adjusts K2, and thus the amplitude of I1.

The current controlled oscillator 108", as explained, generates the output signal Fout based upon I2 as received from the current control DAC 106".

B. Description of Testing and Tuning of Oscillator Circuit

Figure 9:
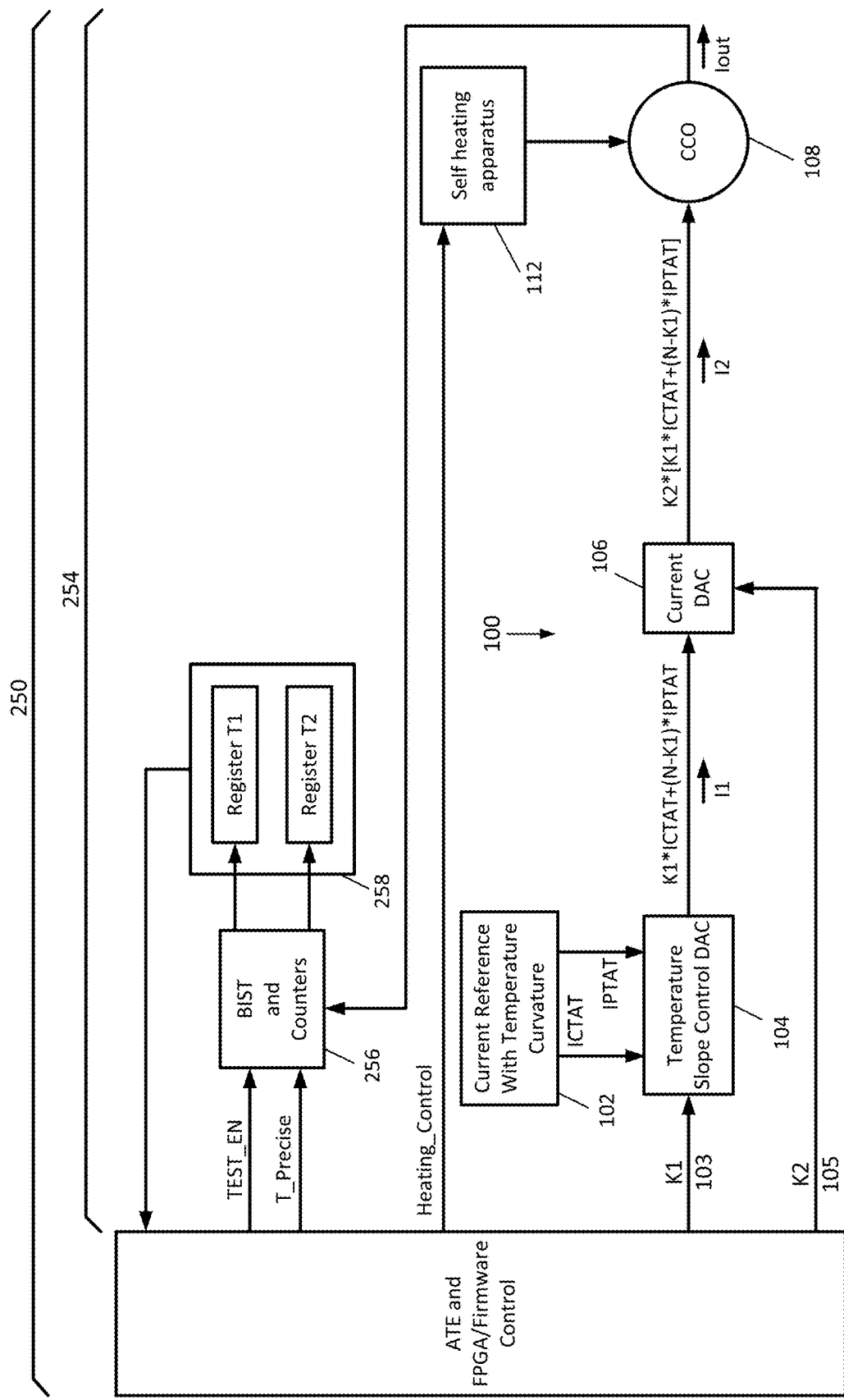
FIG. 9 is a block diagram of an integrated circuit including the oscillator circuit of FIG. 1 when connected to automated test equipment.
Figure 10:
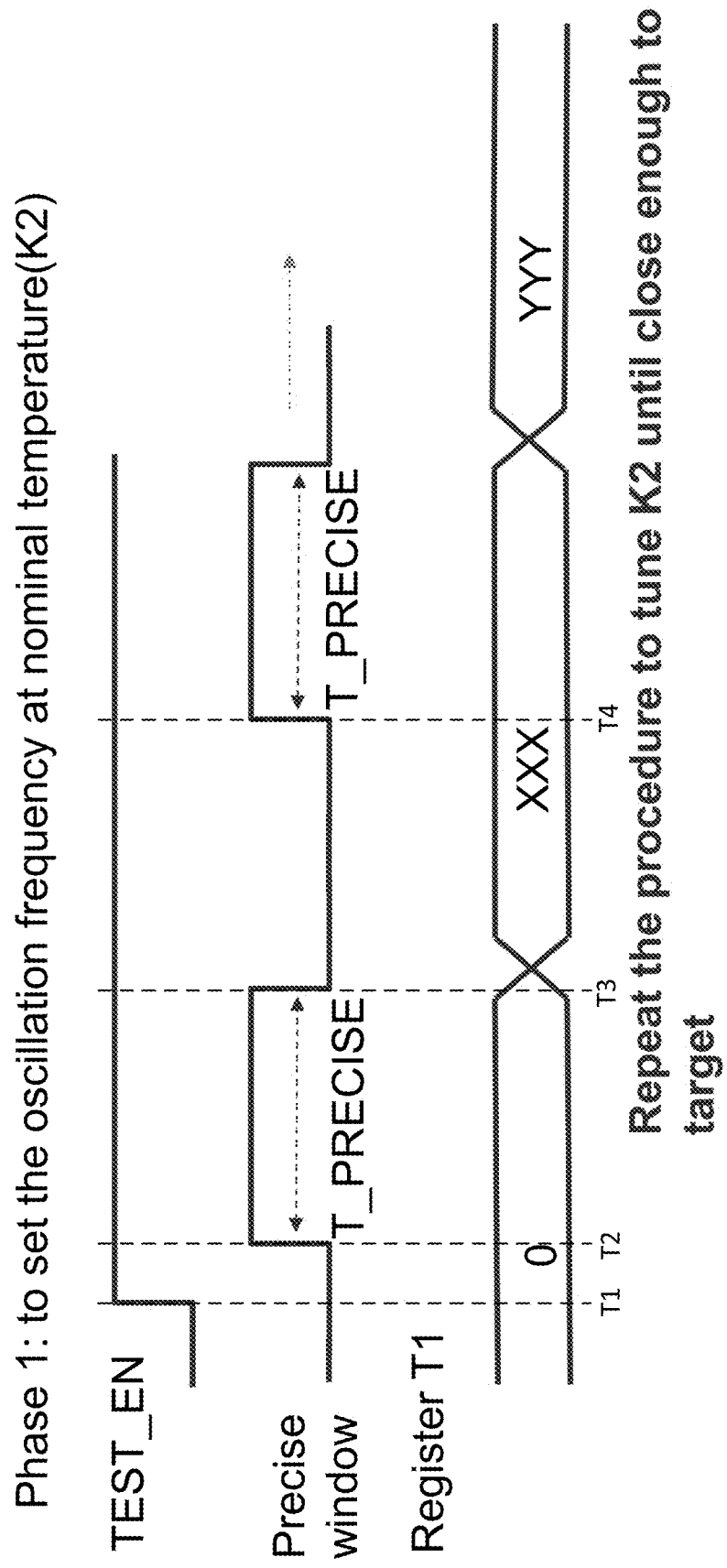
FIG. 10 is a timing diagram of a first test operation performed using the arrangement shown in FIG. 9.

A first tuning arrangement 250 for the tuning of K1 and K2 in the oscillator circuit 100 or oscillator circuit 100' is now described with reference to FIG. 9. The tuning arrangement 250 includes automated test equipment (ATE) 252, which includes an FPGA or other form of firmware control. Connected to the ATE 252 is the chip current control circuit or package 254 which includes the oscillator circuit 100 or oscillator circuit 100', as well as a built in self test (BIST) circuit 256 and a register bank 258. Note that the ATE 252 provides a heating control signal Heating_Control to the self heating apparatus 112, and provides the control signal 103 that tunes K1 as well as the control signal 105 that tunes K2.

Figure 11:
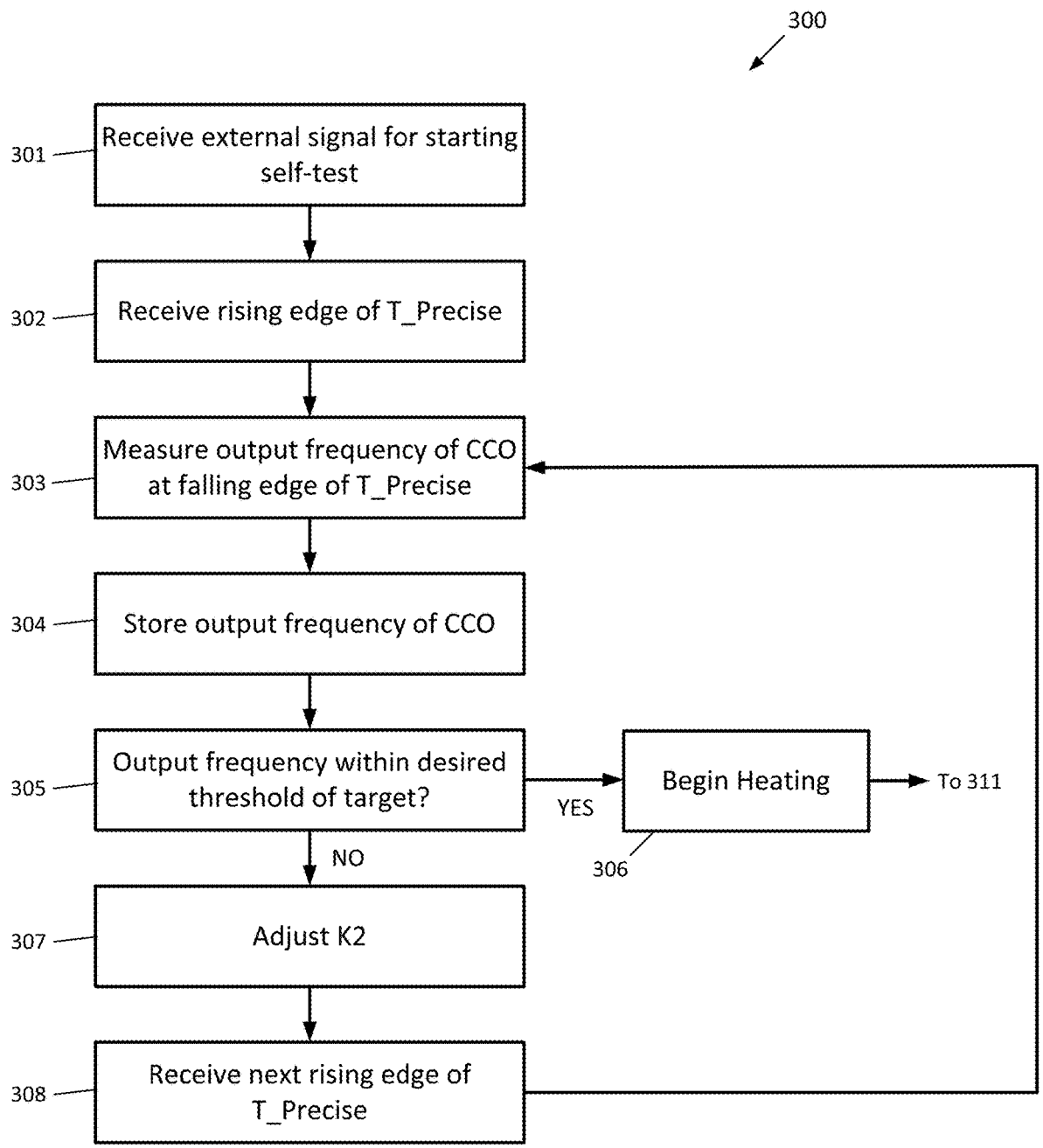
FIG. 11 is a flowchart of a method of performing the first test operation of FIG. 10.
Figure 12:
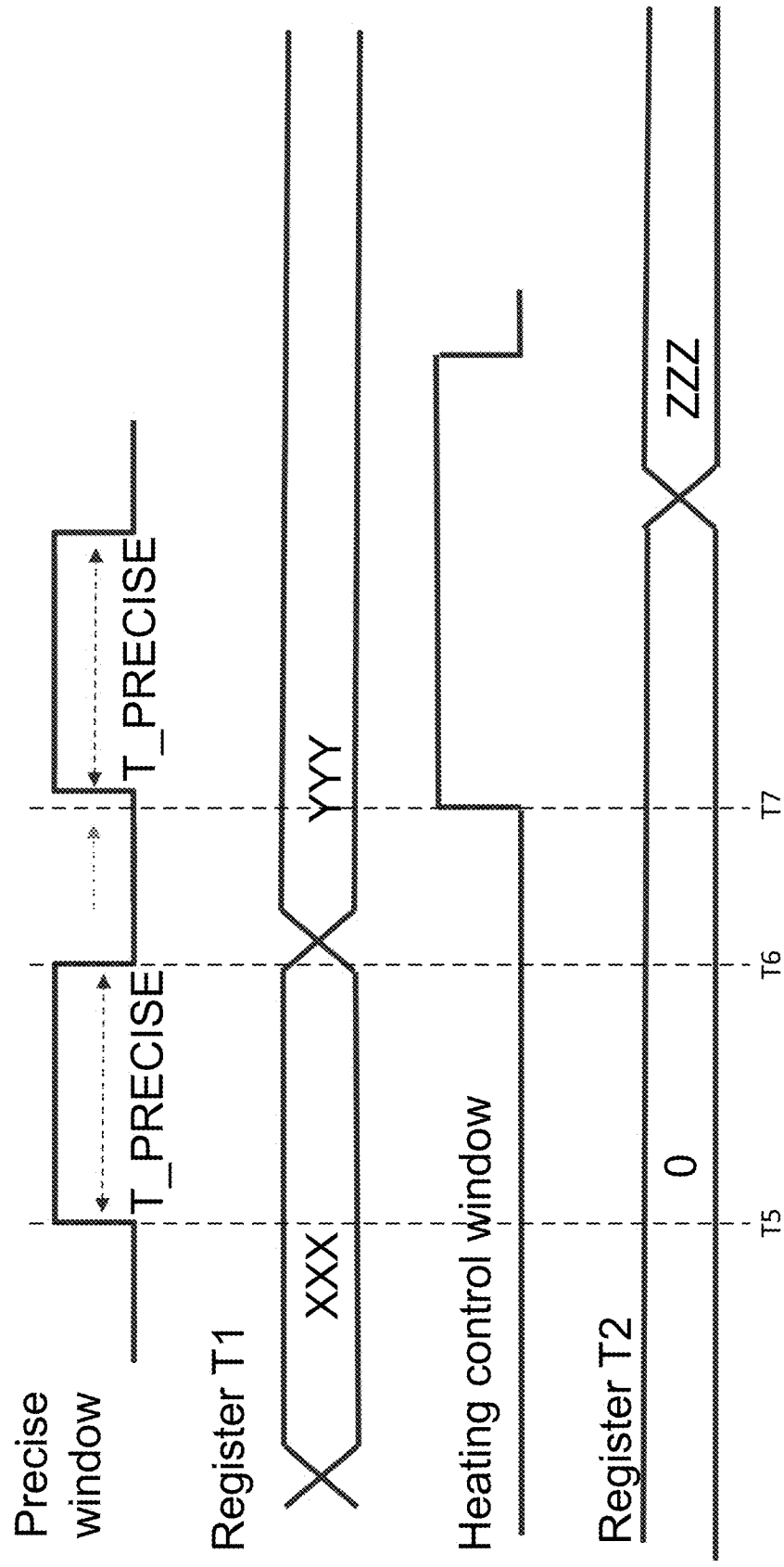
FIG. 12 is a timing diagram of a second test operation performed using the arrangement shown in FIG. 9.

Operation of the first tuning arrangement 250 is now described referring to FIGS. 10-13. At time t1, the test enable signal TEST_EN, fed to the BIST 256, rises (FIG. 10), described generally by the step 301 of receiving an external signal for starting self-testing (FIG. 11). At time t2, the precise timing window signal T_Precise, fed to the BIST 256, rises (FIG. 10), as described in step 302 (FIG. 11). At the falling edge of T_Precise at time t3 (FIG. 10), the output frequency of the CCO 108 (which generates Fout) is measured by the BIST 256, as described in step 303 (FIG. 11). The output frequency of the CCO 108 is then stored in the register bank 258, as described in step 304 (FIG. 11).

If the output frequency is not within a desired threshold of a target frequency stored in the register bank 258, as described in step 305 (FIG. 11), then the ATE 252 alters the control signal 105 to tune K2 as fed to the current control circuit 106, as described in step 307 (FIG. 11). Then, at time t4 (FIG. 10), a next rising edge of T_Precise is received as described in step 308 (FIG. 11), and operation loops back to step 303.

If the output frequency is within the desired threshold of the target frequency stored in the register bank 258, as described in step 305 (FIG. 11), then a self heating procedure is activated at time t5 (FIG. 12), as described in step 306 (FIG. 11).

Figure 13:
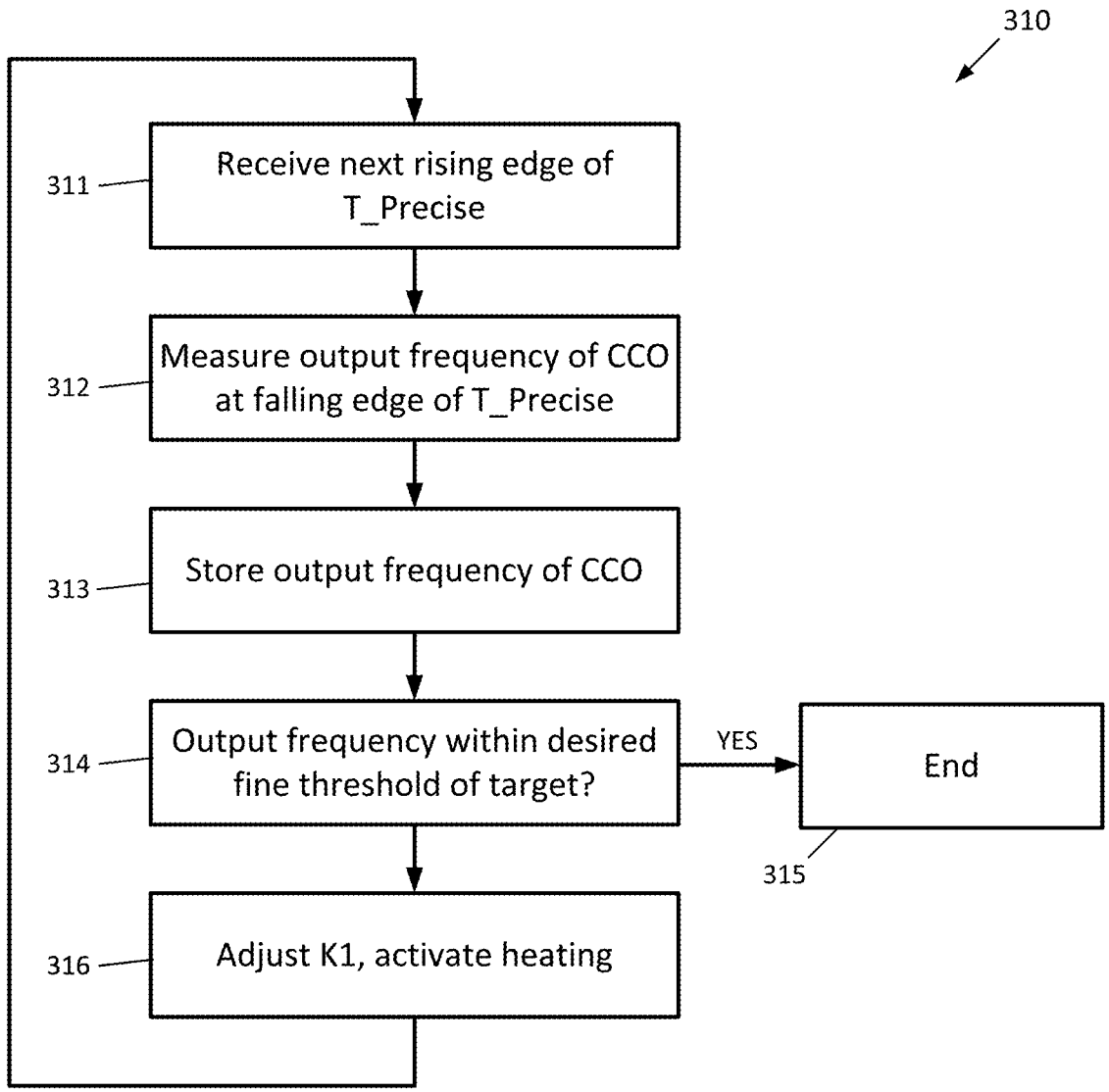
FIG. 13 is a flowchart of a method of performing the second test operation of FIG. 12.

During the self heating procedure, a next rising edge of T_Precise is received at time t5 (FIG. 12) as described in step 311 (FIG. 13), and then at time t6 (FIG. 12), upon the falling edge of T_Precise, the output frequency of the CCO 108 is measured by the BIST 256 as described in step 312 (FIG. 13). The output frequency of the CCO 108 is then stored in the register bank 258, as described in step 313 (FIG. 13). If the output frequency is within a desired fine threshold of the target frequency, as described in step 314 (FIG. 13), then tuning is complete at step 315. If, however, the output frequency is not within the desired fine threshold of the target frequency, then the control signal 103 that controls K1 is altered by the ATE 252 and the self heating apparatus 112 is activated by assertion of the Heating_Control signal at time t7 (FIG. 12), as described in step 316 (FIG. 13). Operation then loops back to step 311 (FIG. 13) and proceeds until, in an iteration of step 314 (FIG. 13), the output frequency is within the desired fine threshold of the target frequency, so tuning is complete at step 315.

Figure 14:
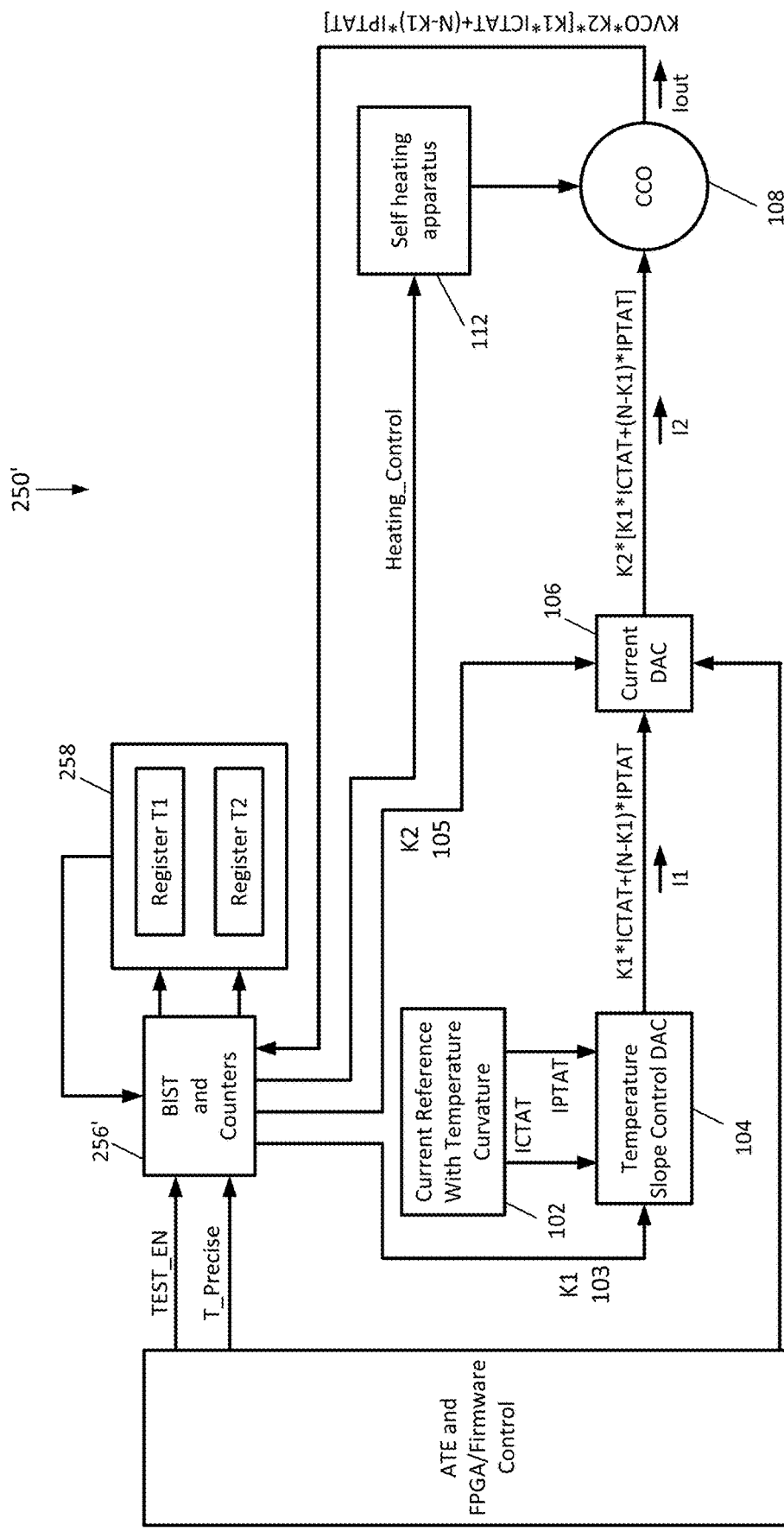
FIG. 14 is a block diagram of an alternative arrangement of integrated circuit including the oscillator circuit of FIG. 1 when connected to automated test equipment.

An alternate tuning arrangement 250' is shown in FIG. 14. The difference between the tuning arrangement 250' and the tuning arrangement 250 is that the BIST 256' outputs the control signals 103 and 105, as well as the Heating_Control signal. Operation is otherwise the same as the tuning arrangement 250. The advantage of this tuning arrangement 250' is less reliance on the ATE 252', meaning fewer probes are needed, potentially reducing production costs.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
a first current generator circuit configured to generate a current complementary to absolute temperature;
a second current generator configured to generate a current proportional to absolute temperature;
a temperature slope control circuit configured to adjust slopes of the current complementary to absolute temperature and the current proportional to absolute temperature in a complementary fashion and to add the adjusted slope current complementary to absolute temperature to the adjusted slope current proportional to absolute temperature to produce a temperature independent current, wherein the temperature slope control circuit adjusts the slopes of the current complementary to absolute temperature and the current proportional to absolute temperature in response to a first control signal;
a current control circuit configured to adjust a magnitude of the temperature independent current to produce a magnitude adjusted temperature independent current, wherein the current control circuit adjusts the magnitude of the temperature independent current in response to a second control signal;
a current controlled oscillator configured to generate an output signal as a function of the magnitude adjusted temperature independent current; and
a built in self test circuit configured to receive the output signal, compare a frequency of the output signal to a desired frequency, and send results of the comparison to automated test equipment, wherein the first and second control signals are received from the automated test equipment.

2. The electronic device of claim 1, further comprising a feedback control circuit configured to affect the adjustment of the slopes of the current complementary to absolute temperature and the current proportional to absolute temperature as a function of the output signal.

3. The electronic device of claim 1, further comprising a heating circuit configured to vary temperature of components of the current controlled oscillator.

4. The electronic device of claim 1, further comprising a heating circuit configured to vary temperature of components of the current controlled oscillator in response to a third control signal received from the automated test equipment.

5. An electronic device, comprising:
a first current generator circuit configured to generate a current complementary to absolute temperature;
a second current generator configured to generate a current proportional to absolute temperature;
a temperature slope control circuit configured to adjust slopes of the current complementary to absolute temperature and the current proportional to absolute temperature in a complementary fashion and to add the adjusted slope current complementary to absolute temperature to the adjusted slope current proportional to absolute temperature to produce a temperature independent current, wherein the temperature slope control circuit adjusts the slopes of the current complementary to absolute temperature and the current proportional to absolute temperature in response to a first control signal;
a current control circuit configured to adjust a magnitude of the temperature independent current to produce a magnitude adjusted temperature independent current, wherein the current control circuit adjusts the magnitude of the temperature independent current in response to a second control signal;
a current controlled oscillator configured to generate an output signal as a function of the magnitude adjusted temperature independent current; and
a built in self test circuit configured to receive the output signal and to generate the first and second control signals based upon a frequency of the output signal.

6. The electronic device of claim 5, further comprising a heating circuit configured to vary temperature of components of the current controlled oscillator in response to a third control signal received from the built in self test circuit.

7. A method of calibrating an oscillator, comprising:
generating a current complementary to absolute temperature;
generating a current proportional to absolute temperature;
generating a temperature independent current from the current complementary to absolute temperature and the current proportional to absolute temperature;
generating an output signal based upon the temperature independent current;
measuring a frequency of the output signal;
if the frequency of the output signal is not within a coarse threshold of a desired frequency, adjusting slopes of the current complementary to absolute temperature and the current proportional to absolute temperature in a complementary fashion until the frequency of the output signal is within the coarse threshold of the desired frequency; and
after the frequency of the output signal is within the coarse threshold of the desired frequency:
adjusting a magnitude of the temperature independent current;
activating a self heating circuit to alter temperature of at least a portion of the oscillator; and
if the frequency of the output signal is not within a fine threshold of a desired frequency, adjusting the magnitude of the temperature independent current and/or adjusting the temperature of at least the portion of the oscillator until the frequency of the output signal is within the fine threshold of the desired frequency.

8. An electronic device, comprising:
a temperature slope control circuit configured to adjust slopes of a current complementary to absolute temperature and a current proportional to absolute temperature and to add the adjusted slope current complementary to absolute temperature to the adjusted slope current proportional to absolute temperature to produce a temperature independent current, wherein the temperature slope control circuit adjusts the slopes of the current complementary to absolute temperature and the current proportional to absolute temperature in response to a first control signal;
a current control circuit configured to adjust a magnitude of the temperature independent current to produce a magnitude adjusted temperature independent current, wherein the current control circuit adjusts the magnitude of the temperature independent current in response to a second control signal;

a current controlled oscillator configured to generate an output signal as a function of the magnitude adjusted temperature independent current; and a test circuit configured to receive the output signal, to compare a frequency of the output signal to a desired frequency, and to send results of the comparison to test equipment;

wherein the first and second control signals are received from the test equipment.

9. The electronic device of claim 8, wherein the slopes of the current complementary to absolute temperature and the current proportional to absolute temperature are adjusted as a function of the output signal.

10. The electronic device of claim 8, further comprising a heating circuit configured to vary temperature of components of the current controlled oscillator.

11. The electronic device of claim 8, further comprising a heating circuit configured to vary temperature of components of the current controlled oscillator in response to a third control signal received from the test equipment.

12. An electronic device, comprising:

a temperature slope control circuit configured to adjust slopes of a current complementary to absolute temperature and a current proportional to absolute temperature and to add the adjusted slope current complementary to absolute temperature to the adjusted slope current proportional to absolute temperature to produce a temperature independent current, wherein the temperature slope control circuit adjusts the slopes of the current complementary to absolute temperature and the current proportional to absolute temperature in response to a first control signal;

a current control circuit configured to adjust a magnitude of the temperature independent current to produce a magnitude adjusted temperature independent current, wherein the current control circuit adjusts the magnitude of the temperature independent current in response to a second control signal;

a current controlled oscillator configured to generate an output signal as a function of the magnitude adjusted temperature independent current; and a test circuit configured to receive the output signal and to generate the first and second control signals based upon a frequency of the output signal.

13. The electronic device of claim 12, further comprising a heating circuit configured to vary temperature of components of the current controlled oscillator in response to a third control signal received from the test circuit.

* * * * *